US011711908B1

(12) United States Patent
Gao

(10) Patent No.: US 11,711,908 B1
(45) Date of Patent: Jul. 25, 2023

(54) SYSTEM AND METHOD FOR SERVICING AND CONTROLLING A LEAK SEGREGATION AND DETECTION SYSTEM OF AN ELECTRONICS RACK

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 0 days.

(21) Appl. No.: 17/655,525

(22) Filed: Mar. 18, 2022

(51) Int. Cl.
*G06F 1/16* (2006.01)
*H05K 5/00* (2006.01)
*H05K 7/00* (2006.01)
*H05K 7/20* (2006.01)

(52) U.S. Cl.
CPC ..... *H05K 7/20327* (2013.01); *H05K 7/20272* (2013.01); *H05K 7/20627* (2013.01)

(58) Field of Classification Search
CPC ........... H05K 7/20327; H05K 7/20272; H05K 7/20627; H05K 7/20663; H05K 7/20763; H05K 7/208
See application file for complete search history.

(56) References Cited

U.S. PATENT DOCUMENTS

| 2009/0100848 A1* | 4/2009 | Kuriyama | F28F 17/005 62/132 |
| 2010/0124012 A1* | 5/2010 | Kondo | G06F 1/20 361/679.47 |
| 2011/0308262 A1* | 12/2011 | Inadomi | H05K 7/20836 62/126 |
| 2012/0291465 A1* | 11/2012 | Kashirajima | H05K 7/20836 62/126 |
| 2013/0019627 A1* | 1/2013 | Yoshikawa | H05K 7/20818 62/426 |
| 2014/0321050 A1* | 10/2014 | Sato | H05K 7/20754 361/679.47 |
| 2016/0037660 A1* | 2/2016 | Budde | H05K 5/0065 439/78 |
| 2016/0330873 A1* | 11/2016 | Farshchian | H05K 7/20672 |
| 2017/0325354 A1* | 11/2017 | Lee | H05K 7/20209 |
| 2018/0320982 A1* | 11/2018 | Nakamura | F28D 15/0275 |
| 2020/0281098 A1* | 9/2020 | Thibaut | H05K 7/20836 |
| 2020/0305312 A1* | 9/2020 | Palmer | H05K 7/20818 |

\* cited by examiner

*Primary Examiner* — Anthony M Haughton
(74) *Attorney, Agent, or Firm* — Womble Bond Dickinson (US) LLP

(57) ABSTRACT

According to one embodiment, a rack cooling module for an electronics rack. The module includes a manifold section that has a supply manifold that is coupled to a supply manifold connector, the supply manifold is arranged to supply liquid coolant from a coolant source to supply manifold connectors, and a return manifold that is coupled to return manifold connectors, the return manifold is arranged to return liquid coolant from the return manifold connector to the coolant source. The module also includes a detection section that has a channel that extends vertically within the detection section and a leak detection sensor that is disposed within the channel, a pump that couples the channel to the return manifold, and a valve that couples the channel to the supply manifold.

20 Claims, 8 Drawing Sheets

SYSTEM AND METHOD FOR SERVICING AND CONTROLLING A LEAK SEGREGATION AND DETECTION SYSTEM OF AN ELECTRONICS RACK

FIELD

Embodiments of the present disclosure relate generally to an electronics rack that includes a leak segregation and detection system.

BACKGROUND

Recently, data centers have been deploying more high-power density electronics racks, where more high-density chips are packaged closer together to provide more processing power. This is especially the case due to developments in artificial intelligence (AI) and cloud-based services, which require high performance and high power density processors, such as control processing units (CPUs) and graphic processing units (GPUs).

Thermal management for a data center that includes several active electronics racks is critical to ensure proper performance of servers and other information technology (IT) equipment (e.g., performing IT data processing services) that is operating in the racks. Without proper thermal management, however, the thermal environment (e.g., temperature) within the racks may exceed thermal operational thresholds, which may result in adverse consequences (e.g., servers failing, etc.). One way to manage the thermal environment is to liquid cool the IT equipment. For instance, equipment may include cold plates on which processors are mounted within the equipment. Cooling liquid is passed through the cold plates in order to transfer heat away from the active processors.

With fluid flowing through liquid cooling equipment, such as tubes, fittings, etc., within the rack, leaks may occur (e.g., due to wear and tear, defective parts, mal-operation, etc.). As a result, fluid may leak onto the electronics (e.g., servers) that are mounted in the rack. Thus, there is a need for a leak segregation and detection system that prevents leaking fluid (e.g., from fittings) from spreading throughout an electronics rack and coming into contact with electronics mounted therein, as well as detects the leaking fluid in order manage (e.g., deactivate) electronics that may be affected by the leaking fluid. In addition, to detect the leaks the system may include one or more leak detection sensors, which produce electrical signals in response to detecting a presence of liquid. Such sensors may require maintenance (e.g., in order to avoid malfunctioning due to wear and tear). As a result, there is a need for the system to be able to maintain (e.g., performance of) the leak detection sensors.

BRIEF DESCRIPTION OF THE DRAWINGS

The embodiments are illustrated by way of example and not by way of limitation in the figures of the accompanying drawings in which like references indicate similar elements. It should be noted that references to "an" or "one" embodiment of this disclosure are not necessarily to the same embodiment, and they mean at least one. Also, in the interest of conciseness and reducing the total number of figures, a given figure may be used to illustrate the features of more than one embodiment, and not all elements in the figure may be required for a given embodiment.

DETAILED DESCRIPTION

Figure 1:
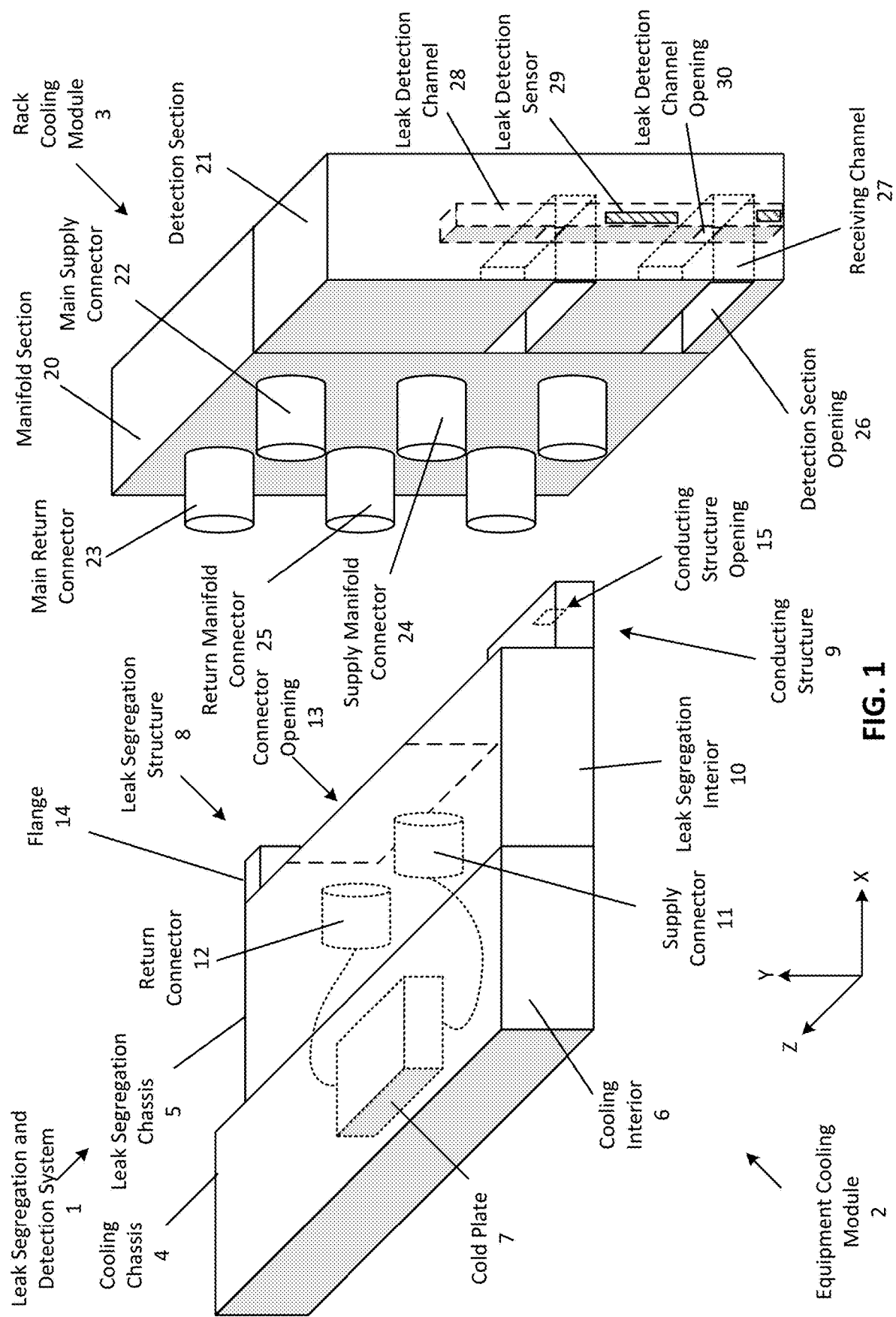
FIG. 1 shows an example of a leak segregation and detection system that has an equipment cooling module and a rack cooling module according to one embodiment.

Several embodiments of the disclosure with reference to the appended drawings are now explained. Whenever the shapes, relative positions and other embodiments of the parts described in a given embodiment are not explicitly defined, the scope of the disclosure here is not limited only to the parts shown, which are meant merely for the purpose of illustration. Also, while numerous details are set forth, it is understood that some embodiments may be practiced without these details. In other instances, well-known circuits, structures, and techniques have not been shown in detail so as not to obscure the understanding of this description. Furthermore, unless the meaning is clearly to the contrary, all ranges set forth herein are deemed to be inclusive of each range's endpoints.

Reference in the specification to "one embodiment" or "an embodiment" means that a particular feature, structure, or characteristic described in conjunction with the embodiment can be included in at least one embodiment of the disclosure. The appearances of the phrase "in one embodiment" in various places in the specification do not necessarily all refer to the same embodiment.

The present disclosure solves the problem of servicing (or maintaining) (e.g., one or more leak detection sensors of) a leak segregation and detection system in order to ensure that the (e.g., sensors of the) system operate accurately in order to detect leaks of liquid coolant. Specifically, the system may be serviced by determining whether components of the system are operating normally (e.g., functioning according to predefined specifications), and upon determining that one or more components are not functioning normally, performing maintenance (or servicing) the components (e.g., by replacing the components, etc.). For instance, a rack cooling module of the system includes a manifold section with a supply manifold that couples one or more supply manifold connectors to a coolant source and a return manifold that couples one or more return manifold connectors to the source. The module also includes a detection section with a vertical channel in which one or more leak detections sensors are disposed, a pump that is coupled between the channel and the return manifold and a valve that is coupled between the channel and the supply manifold. Such a configuration allows for maintenance and servicing of the sensors by using liquid coolant from the supply manifold to test the sensors. For example, a controller of the system may open the valve to allow liquid coolant to flow into the channel, while the pump may be activated to push the liquid coolant into the return manifold. While the liquid coolant flows, the sensors are arranged to detect the presence of liquid coolant flowing through the channel and transmit an electronic (control) signal to the controller. If the controller receives the signal, it may be indicative of the sensor being operable, whereas if the signal is not received it may be indicative that the sensor is not operating normally (e.g., malfunctioning). As a result, the valve may be closed and the malfunctioning sensor may be serviced.

In one embodiment, the system also includes an equipment cooling module that includes liquid cooling components (e.g., a cold plate, lines or tubes, distribution manifolds, etc.) within a cooling chassis. The module may also include a leak segregation chassis that is coupled to the cooling chassis and has connectors that are coupled to the liquid cooling components. Specifically, the leak segregation chassis may contain (or surround) the connectors, thereby preventing any leaking (or spraying) liquid that may leak from the connectors from spilling out from the equipment cooling module. The leak segregation chassis may also have a connector opening that is arranged to receive supply and return manifold connectors (e.g., of the rack cooling module) for coupling to the cooling module's connectors. The equipment module may also include a conducting structure that is arranged to couple to the detection section such that an opening of the conducting structure opens into the channel. Thus, when the equipment cooling module is coupled to the rack cooling module, the connectors of the equipment cooling module couple to manifold connectors of the rack cooling module to creak a heat exchanging loop. In addition, when coupled, any leaks that may occur within the cooling module (e.g., at one of the connectors contained therein), may be contained within the module, and in addition, any leaking liquid within the cooling module may be guided (e.g., by a conducting path within the conducting structure) out through the conducting structure opening and into the channel of the detection section.

The present disclosure also solves the problem of controlling the leak segregation and detection system, upon a detection of a liquid coolant leak. In particular, upon detecting a leak from an equipment module that is coupled to the rack cooling module 3, the system may be configured to continue to supply liquid coolant to the leaking equipment module in order to allow the equipment module to operate for a period of time. For example, while a heat exchanging loop is established between the equipment cooling module and the rack cooling module, the system may detect a liquid coolant leak from a leak detection sensor that is disposed within the channel in the detection section. Upon detecting the leak, the system may activate the pump to draw leaking liquid coolant out of the channel and into the return manifold. During this time, the equipment module may continue to operate without interruption. In addition, during this time, operations being performed by the equipment module may be off loaded to one or more other equipment modules (e.g., within the rack or other racks), and once off loaded the equipment module may be deactivated and the heat exchanging loop may be shut off (e.g., by preventing liquid coolant from flowing into and out of the module). Thus, the leak segregation and detection system allows operations to continue to be performed (e.g., for a certain period of time) and off loaded seamlessly to other equipment modules before the module that is leaking is shut off.

According to one embodiment, a rack cooling module for an electronics rack includes a manifold section that includes a supply manifold that is coupled to a supply manifold connector, the supply manifold is arranged to supply liquid coolant from a coolant source to the supply manifold connector, and a return manifold that is coupled to a return manifold connector, the return manifold is arranged to return liquid coolant from the return manifold connector to the coolant source; a detection section that includes a channel that extends vertically within the detection section, and a leak detection sensor that is disposed within the channel; a pump that couples the channel to the return manifold; and a valve that couples the channel to the supply manifold.

In another embodiment, the valve is a first valve, wherein the rack cooling module further comprises a second valve that is coupled between the pump and the return manifold. In some embodiments, the pump is coupled to a bottom end of the channel. In one embodiment, the valve is coupled to a top end of the channel, wherein the leak detection sensor is disposed between the top end and the bottom end of the channel. In some embodiments, the valve is coupled to the supply manifold above the supply manifold connector.

In one embodiment, the rack cooling module further comprises a controller that is electrically coupled to the leak detection sensor and the pump, wherein the controller is configured to activate the pump in response to receiving a control signal from the leak detection sensor that indicates a presence of liquid coolant within the channel. In another embodiment, the controller is electrically coupled to the valve, and is configured to open the valve to allow the liquid coolant to flow from the supply manifold into the channel to determine whether the leak detection sensor is functioning based on whether the control signal is received. In one embodiment, the detection section further includes an opening into the channel that is arranged to receive liquid coolant that leaks from an equipment cooling module that is coupled to the rack cooling module, wherein the leak detection sensor is arranged to detect a presence of liquid coolant that flows from either 1) the opening of the detection section or 2) a portion of the channel that is above the opening.

According to another embodiment, a leak segregation and detection system for an electronics rack comprises: a rack cooling module that includes: a manifold section that has a supply manifold that is coupled to a supply manifold connector, the supply manifold is arranged to supply liquid coolant from a coolant source to the supply manifold connector, and a return manifold that is coupled to a return manifold connector, the return manifold is arranged to return liquid coolant from the return manifold connector to the coolant source, a detection section that includes: a channel that extends vertically within the detection section, a first opening into the channel, and a leak detection sensor that is disposed within the channel, a pump that couples the channel to the return manifold, and a valve that couples the channel to the supply manifold; and an equipment cooling module that includes: a pair of supply and return connectors that are coupled to a cold plate that is arranged to couple with an information technology (IT) component of an electronics board, and a conducting structure that includes a second opening that opens into an interior of the equipment cooling module in which the cold plate is disposed, wherein the equipment cooling module is arranged to couple to the rack cooling module by the pair of supply and return connectors coupling to the supply and return manifold connectors, respectively, and the conducting structure insertably coupling into the first opening such that the second opening opens into the channel.

In one embodiment, the valve is a first valve, wherein the rack cooling module further comprises a second valve that is coupled between the pump and the return manifold. In another embodiment, the pump is coupled to a bottom end of the channel. In some embodiments, the valve is coupled to a top end of the channel, wherein the leak detection sensor is disposed between the top end and the bottom end of the channel. In one embodiment, the valve is coupled to the supply manifold above the supply manifold connector.

In some embodiments, the leak segregation and detection system further comprises a controller that is electrically coupled to the leak detection sensor and the pump, wherein the controller is configured to activate the pump in response to receiving a control signal from the leak detection sensor that indicates a presence of liquid coolant within the channel. In one embodiment, the controller is electrically coupled to the valve, and is configured to open the valve to allow the liquid coolant to flow from the supply manifold into the channel to determine whether the leak detection sensor is functioning based on whether the control signal is received. In another embodiment, the leak detection sensor is arranged to detect a presence of liquid coolant that flows from either 1) the first opening of the detection section or 2) a portion of the channel that is above the first opening.

According to another embodiment, a method performed by a rack cooling module for an electronics rack, the method comprising: while a heat exchanging loop is established between an equipment cooling module and the rack cooling module in which liquid coolant within a supply manifold of the rack cooling module flows through a cold plate of the equipment cooling module and into a return manifold of the rack cooling module; receiving a control signal from a leak detection sensor that is disposed within a channel of a detection section of the rack cooling module that indicates a presence of liquid coolant within the channel; and in response to receiving the control signal, activating a pump that is coupled between the channel of the return manifold, wherein the equipment cooling module includes a conducting structure that has a first opening that opens into an interior of the equipment cooling module in which the cold plate is disposed, wherein the equipment cooling module couples to the rack cooling module by a supply connector and a return connector of the equipment cooling module coupling to a supply manifold connector of the supply manifold and a return manifold connector of the return manifold, respectively, and the conducting structure insertably couples into a second opening such that the first opening opens into the channel.

In another embodiment, the method further comprises, after a period of time from when the control signal is received, preventing liquid coolant from flowing from the supply manifold into the equipment cooling module. In some embodiments, the method further comprises determining whether the leak detection sensor is functioning by opening a valve that is coupled between the supply manifold and the channel such that liquid coolant is allowed to flow from the supply manifold and into the channel. In one embodiment, the method further comprises, in response to receiving the control signal, opening a valve that is coupled between the pump and the return manifold before activating the pump.

In one embodiment, as used herein, "to couple" one component (or element) to another component may refer to "fluidly" coupling the two components so that a fluid (or liquid), such as a cooling liquid or a liquid coolant may flow between the two components. For example, coupling a first tube to a second tube may couple both tubes together such that liquid coolant may flow from the first tube into the second tube (and/or vice a versa).

FIG. 1 shows an example of a leak segregation and detection system 1 that has an equipment cooling module 2 and a rack cooling module 3 according to one embodiment. In one embodiment, the equipment cooling module (which hereafter may be referred to as "equipment module") is arranged to couple to the rack cooling module (which hereafter may be referred to as "rack module") for liquid cooling (e.g., producing a heat exchanging loop) and leak segregation and detection. In some embodiments, one or more equipment modules may be coupled to the rack module, each forming individual heat exchanging loops. More about the loops is described herein.

This figure shows a perspective view (and an internal perspective view) of both modules, which are arranged to be included with (or contained inside) an electronics rack. Specifically, the equipment module is arranged to provide liquid cooling to one or more electronics boards (e.g., servers), and is arranged (or designed) to segregate (or prevent) any liquid flowing through the module (e.g., which may leak from one or more liquid cooling components contained therein) from leaking (or spilling) out of the module, thereby preventing leaking liquid from coming into contact with other components (e.g., servers) within an electronics rack (e.g., when the cooling module is mounted within the rack). More about how the cooling module segregates leaking liquid from a remainder of the electronics rack is described herein.

As shown, the equipment module includes a cooling chassis 4 that is positioned towards (or at) a backend of the module (e.g., away from the rack module 3), and includes a leak segregation chassis 5 that extends from the cooling chassis towards a frontend of the module (e.g., towards the rack module). In one embodiment, both chassis are one integrated unit. For instance, both chassis may be composed of one or more pieces of material (e.g., a metal, plastic, etc.) that is formed into one integrated chassis (e.g., and are therefore fixedly coupled to one another). Thus, the cooling module may be a sealed enclosure that includes one or more openings that are positioned at the frontend of the module, as described herein. In another embodiment, the chassis may be removably coupled to one another (e.g., via one or more fasteners, etc.).

As described herein, the cooling chassis includes liquid cooling components that are arranged to cool one or more electronics boards (or more specifically IT components that are mounted on the board), and the leak segregation chassis is arranged to prevent liquid from leaking out of the cooling module. In another embodiment, the leak segregation chassis is also arranged to provide one or more openings through the cooling module may be coupled to one or more (e.g., manifold) connectors in order to create one or more heat exchanging loops and one or more openings which liquid may be guided out of the cooling module. More about the components of the leak segregation chassis is described herein.

In one embodiment, the equipment module includes an interior opening (not shown) that (e.g., fluidly) couples an interior (or cooling interior) 6 of the cooling chassis (e.g., a hollow space that is within or is surrounded by the cooling chassis) to an interior (or leak segregation interior) 10 of the leak segregation chassis such that liquid may flow from the cooling interior 6 into the leak segregation interior 10 (and/or vice-a-versa). As described herein, this opening may allow liquid coolant that leaks within the cooling chassis to flow from the cooling interior into the leak segregation interior.

The leak segregation chassis 10 includes (or is composed of) a leak segregation structure 8 and a conducting structure 15. As shown, both structures are fluidly coupled to one another, such that the leak segregation interior 10 includes an interior of the leak segregation structure and an interior of the conducting structure.

The leak segregation structure 8 includes a (e.g., pair of connectors that include a) supply connector 11 and a return connector 12 contained therein. This structure also includes a connector (or first) opening 13 that is arranged (or sized) to receive a supply manifold connector and a return manifold connector (e.g., supply and return manifold connectors 24 and 25 shown herein) of the rack module 3 for (removably) coupling to the supply and return connectors, respectively. In some embodiments, the connector opening 13 may be arranged to receive manifold connectors, while also being arranged to prevent liquid from leaking out from the interior of the leak segregation chassis. For example, the leak segregation structure 8 may have an elevated edge of the opening 13 (e.g., an elevated edge with respect to a bottom of the equipment module), which prevents liquid from leaking out of the opening.

As shown, the connector opening 13 is positioned (or located) in front (e.g., of a front side) of the supply and return connectors. Specifically, the connector opening and the supply and return connectors may be separated by a length, such that the connector opening is positioned in front of the connectors. As a result, both connectors may be completely surrounded by the leak segregation structure. In some embodiments, the opening 13 may extend beyond the connectors such that the leak segregation structure may (e.g., at least partially) contain the supply and return manifold connectors and the supply and return connectors when both pairs of connectors are coupled to each other. More about coupling the cooling module to manifold connectors is described herein.

In addition, the connector opening 13 is recessed between the conducting structure 18 and a flange (or extended arm) 14 that are positioned on opposite sides of the opening. Specifically, the conducting structure is on a right (or first) side of the opening 13 and the flange is positioned on a left (or second) side of the opening. As described herein, this configuration may promote the equipment cooling module's removable coupling to the rack cooling module. In one embodiment, the flange and conducting structure may extend beyond the connector opening 13 towards its frontend, having different lengths. For instance, the conducting structure 18 may extend beyond the opening at one length, whereas the flange may extend beyond the opening at another length that is less than the length of the conducting structure. In another embodiment, their lengths may be the same.

In one embodiment, the flange may be arranged to provide a more robust design to contain or capture leaked liquid within the equipment cooling module. For instance, the flange may extend from the cooling chassis and out past the connector opening 13, where the flange prevents liquid from escaping a side of the leak segregation chassis. In another embodiment, the flange may be arranged to secure the equipment cooling module to the rack cooling module. More about securing the modules together is described herein.

The conducting structure 9 includes a conducting (or second) opening 15 that is adjacent to the connector opening 13, where both openings open towards the frontend of the equipment module. Specifically, the opening 15 opens into the interior 10 (and interior 6) of the equipment module in which the cold plate 7 is disposed. In one embodiment, the openings may open towards different directions. Specifically, the connector opening opens towards the frontend, while the conducting opening may open towards a side of the equipment cooling module. In one embodiment, the connector opening and the conducting opening are the only openings into the equipment cooling module 2 (e.g., in order to limit a number of locations at which liquid may leak out).

In one embodiment, the conducting structure 9 may include a conducting path (not shown) that extends from the interior 10 of the leak segregation chassis to the conducting opening 15 and is arranged to guide liquid from the interior of the leak segregation chassis to and out of the conducting opening. In one embodiment, the path may extend from the interior 6 of the cooling chassis. In which case, the path may extend through an interior opening between the two chassis. In some embodiments, the conducting path may have a geometry or shape (e.g., a length, a width, a slope (or taper), etc.) that promotes liquid to (e.g., naturally) move along the conducting path towards the conducting opening. For instance, the geometry of the path may use gravity to move the liquid from one location along the conducting path to the opening. In one embodiment, this path may have a width that is equal to a width of the conducting structure opening. In another embodiment, the width of the path may taper as it moves from the interior of the chassis 5 and towards the opening 15.

As described herein, the cooling chassis 3 may include one or more pieces of liquid cooling components. As shown, the cooling chassis includes a cold plate 7 that is coupled to the supply and return connectors 11 and 12, via tubes (or lines). In one embodiment, the cooling chassis may include more or less components, such as having more cold plates (e.g., which may be coupled together in series and/or in parallel). In which case, the cooling chassis may include a supply distribution manifold and a return distribution manifold, where the supply distribution manifold couples the supply connector 11 to (e.g., one or more of) the cold plates, while the return distribution manifold couples (one or more of) the cold plates to the return connector 12. In one embodiment, the components may be coupled together via lines (or tubes) that supply and/or return liquid (coolant) from one component to another. In which case, the components may include one or more inlets and/or one or more outlets, each of which may include a connector, where the connectors of different components may be coupled (or connected) together via one or more lines (e.g., flexible tubes). Thus, when the supply and return connectors are coupled to a coolant source (e.g., via supply and return manifold connectors), a heat exchange loop is created. Specifically, once coupled to the coolant source, the supply connector supplies liquid coolant from the source to the cold plate, which when coupled to (e.g., in contact with) one or more IT components of one or more electronics boards (or pieces of IT equipment) are designed to draw heat away from the components and into the coolant flowing therein, thereby warming the coolant. The cold plate provides the warmed coolant to the return connector 12, which returns the warmed coolant to the coolant source.

As described herein, the cold plate may be contained within the cooling interior 6. In which case, when the cold plate is coupled to an IT component, the cooling chassis 4 may be coupled between the cold plates and IT components such that the cooling chassis separate a cold plate from a respective IT component from which the cold plate draws heat. Thus, thermal energy may pass from the IT components, through the cooling chassis, and into the cold plate. In which case, the cooling chassis may be composed of any thermally conductive material (e.g., a material having a thermal conductivity that is greater than a predetermined threshold) in order to promote the thermal heat transfer into the cold plates.

In another embodiment, the cold plate may extend out of the cooling chassis. For example, the cooling chassis may include one or more openings (not shown) that may be positioned along a bottom (side or top) of the cooling chassis. In which case, one or more cold plates may be mounted into an opening, through which at least one side of the mounted cold plate may be exposed out from the cooling chassis and into the environment, whereas a remainder of the cold plate may be enclosed within the cooling interior 6. As a result, when the equipment cooling module is mounted on an electronics board, one or more cold plates may come into (e.g., direct) contact with one or more IT components that are mounted on the board. As a result, the cold plate may couple to an IT component, without (e.g., at least a portion of) the cooling chassis being coupled between the plate and the component.

As described herein, the leak segregation chassis 5 includes the supply connector 11 and the return connector 12. For example, the connectors may be fixedly coupled to (e.g., at least one internal side of) the leak segregation chassis. In one embodiment, the connectors may be held (or mounted) in place within the chassis through one or more connector holders (e.g., that are fixed to the segregation chassis and/or fixed to at least a portion of the cooling chassis). In another embodiment, the connectors may be housed within the leak segregation chassis using any mechanical structure.

Figure 8:
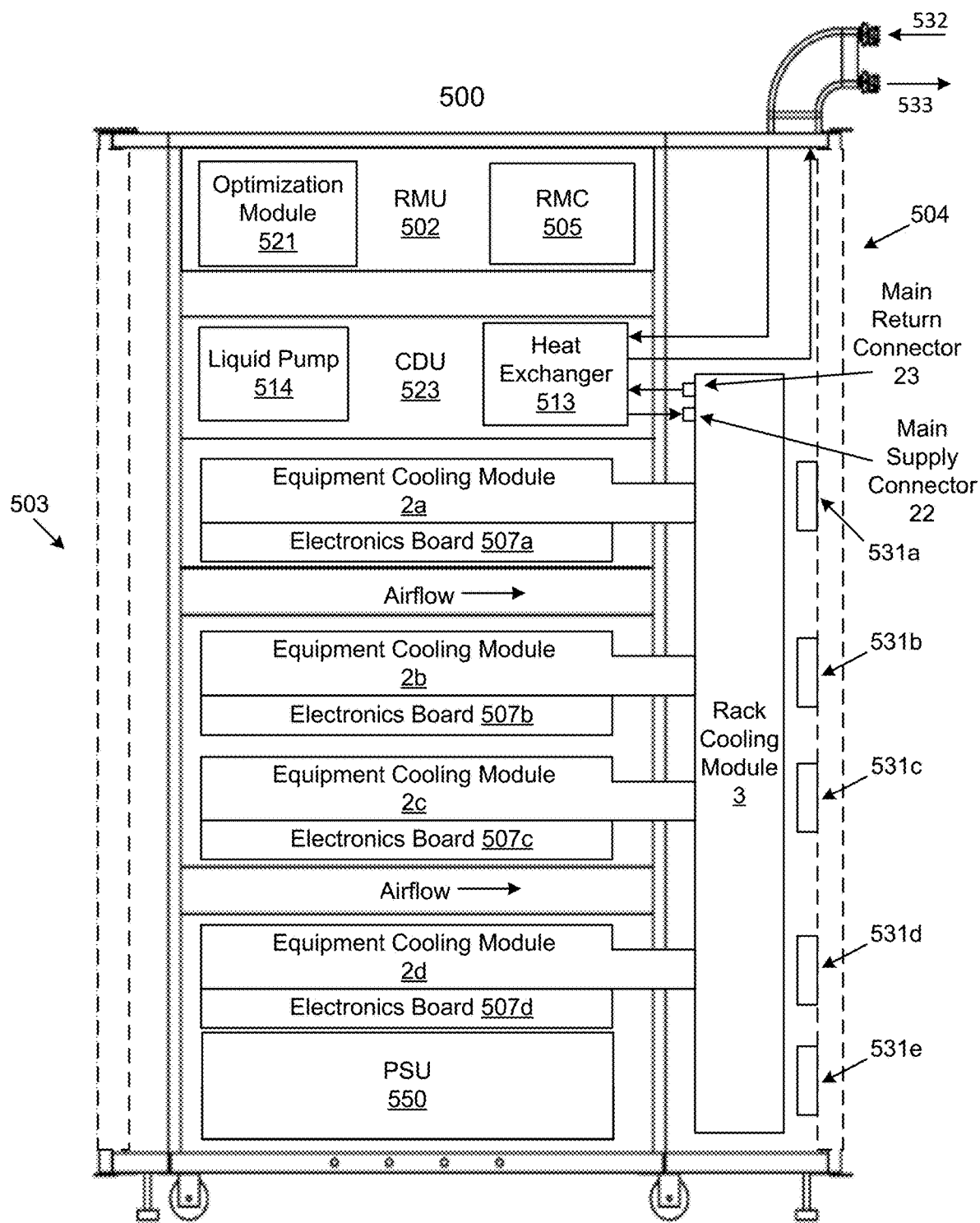
FIG. 8 is an example of an electronics rack that includes a leak segregation and detection system according to one embodiment.

This figure also shows a perspective view of the rack module 3, which includes a manifold section 20 and a detection section 21. As shown, the detection section is adjacent to (or next to) the manifold section. In one embodiment, both sections may be one integrated unit (e.g., both sections being composed of one housing or frame). In another embodiment, both sections may be fixedly coupled or removably coupled to one another. In addition, this figure shows that both sections are of a same height. In one embodiment, the rack cooling module is arranged to be housed (or contained) within (e.g., a housing of) the electronics rack. In one embodiment, the sections may be sized to fit within an electronics rack (e.g., having a height that is equal to or less than a height of 42 U). In another embodiment, the sections may be sized differently (e.g., the sections having different heights). In some embodiments, the rack cooling module may be removably coupled (or mounted) inside the electronics rack, as shown in FIG. 8.

The manifold section includes a main supply connector 22 and a main return connector 23, which are arranged to couple to a coolant source (e.g., which may be a part of an electronics rack or a separate coolant source). The manifold section also includes two pairs of manifold connectors, each pair having a supply manifold connector 24 and a return manifold connector 25. Specifically, the pairs of manifold connectors are positioned below the main supply and return connectors and are arranged in a stack (e.g., the pairs being stacked in a vertical column). Although illustrated has having four pairs of connectors, the manifold section may include more or less pairs of connectors, such as having one pair of connectors. As described herein, each pair of manifold connectors may be arranged to (e.g., removably) couple to the (e.g., respective) pair of connectors of the equipment cooling module.

In one embodiment, each supply manifold connector 24 is coupled to the main supply connector 22, via a supply manifold (e.g., manifold 50, shown in FIG. 5) for receiving liquid coolant from a coolant source and each return manifold connector 25 is coupled to the main return connector 23, via a return manifold (e.g., manifold 51, shown in FIG. 5) for returning (e.g., warmed) liquid coolant to the coolant source. In one embodiment, both manifolds are positioned inside the manifold section. More about the manifolds is described herein.

In one embodiment, the manifold connectors may be the same type and/or size of (e.g., liquid) connectors of the equipment module. In another embodiment, the manifold connectors may be different than the main supply and return connectors. For example, the main connectors may be of a different type and/or size than the manifold connectors. In this case, the main connectors have a larger diameter than a diameter of the manifold connectors (e.g., which may allow the main connectors to provide a sufficient flow of liquid to and from the manifold connectors).

The detection section 21 includes two detection section openings 26 that open into (or are fluidly coupled to) a leak detection channel 28. As shown, the leak detection channel extends vertically within the detection section. Within (e.g., at least a portion of) the channel are one or more leak detection sensors 29 that are each arranged in the channel to detect a presence of liquid that flows into the channel from one or more openings (e.g., opening 26) into the channel. In one embodiment, the leak detection sensor may comprise a leak detection cable is extends a portion of a length of the channel, and is configured to produce a control signal that indicates a presence of liquid, when liquid comes into contact with the leak detection cable. For instance, the detection cable may include at least two wires, and when (e.g., a conductive) liquid comes into contact with the cable, the liquid creates a short between the two wires. Once this occurs, the leak detection sensor detects the short and produces the control signal. In some embodiments, the rack cooling module may use any type of leak detection sensor (and/or cable) to detect a presence of liquid (e.g., within the leak detection channel). In one embodiment the leak detection sensor may transmit the control signal to one or more controllers (e.g., of the electronics rack), which in response may perform one or more leak detection (or mitigation) operations. More about these operations is described herein.

In addition, the detection section includes receiving channels 27 that are each arranged to couple openings of the detection section to the leak detection channel. Specifically, each receiving channel couples a detection section opening 26 to a leak detection channel opening 30, and is arranged to receive (at least a portion of) a conducting structure 15 of an equipment cooling module that is being coupled to the rack cooling module. More about the receiving channel receiving the conducting structure is described herein. In one embodiment, the leak detection channel opening 30 is smaller than the detection section opening 26. In another embodiment, the opening 30 may be the same size (having similar or the same dimensions) as the conducting structure opening 15. In another embodiment, the structure opening may be smaller than the channel opening 30.

In one embodiment, the leak detection channel 28 and the one or more leak detection sensors (or leak detection cables of the sensors) 29 are vertically orientated (with respect to the rack cooling module) in order to promote leak detection.

For example, when liquid enters the channel, it travels downward along (e.g., the sides of) the channel 28. As a result, the traveling liquid may cover a significant amount of surface area of the leak detection channel, which may increase (e.g., above a threshold) a likelihood that liquid is detected when it comes into contact with the sensor. In one embodiment, in addition, the leak detection channel may be sized in order to ensure that liquid within the channel comes into contact with the sensor. For example, the channel may be sized to fit the sensor, while minimizing an amount of open space between the sensor and the walls of the channel. In addition, although shown to be rectangular, the leak detection channel may be any shape (e.g., the channel may be shaped similarly to the leak detection sensor, both of which having a cylindrical shape).

In one embodiment, each of the openings 26 is associated with and adjacent to a corresponding pair of manifold connectors. Specifically, each opening 26 is positioned below its respective pair of manifold connectors along a vertical axis (e.g., which runs through a top and bottom of the rack cooling module). In some embodiments, the openings may be below their respective connectors such that at least a bottom of the openings is below a bottommost point of the respective connectors. Being below the connectors ensures that water will flow downward towards and into their respective opening, as described herein.

Figure 2:
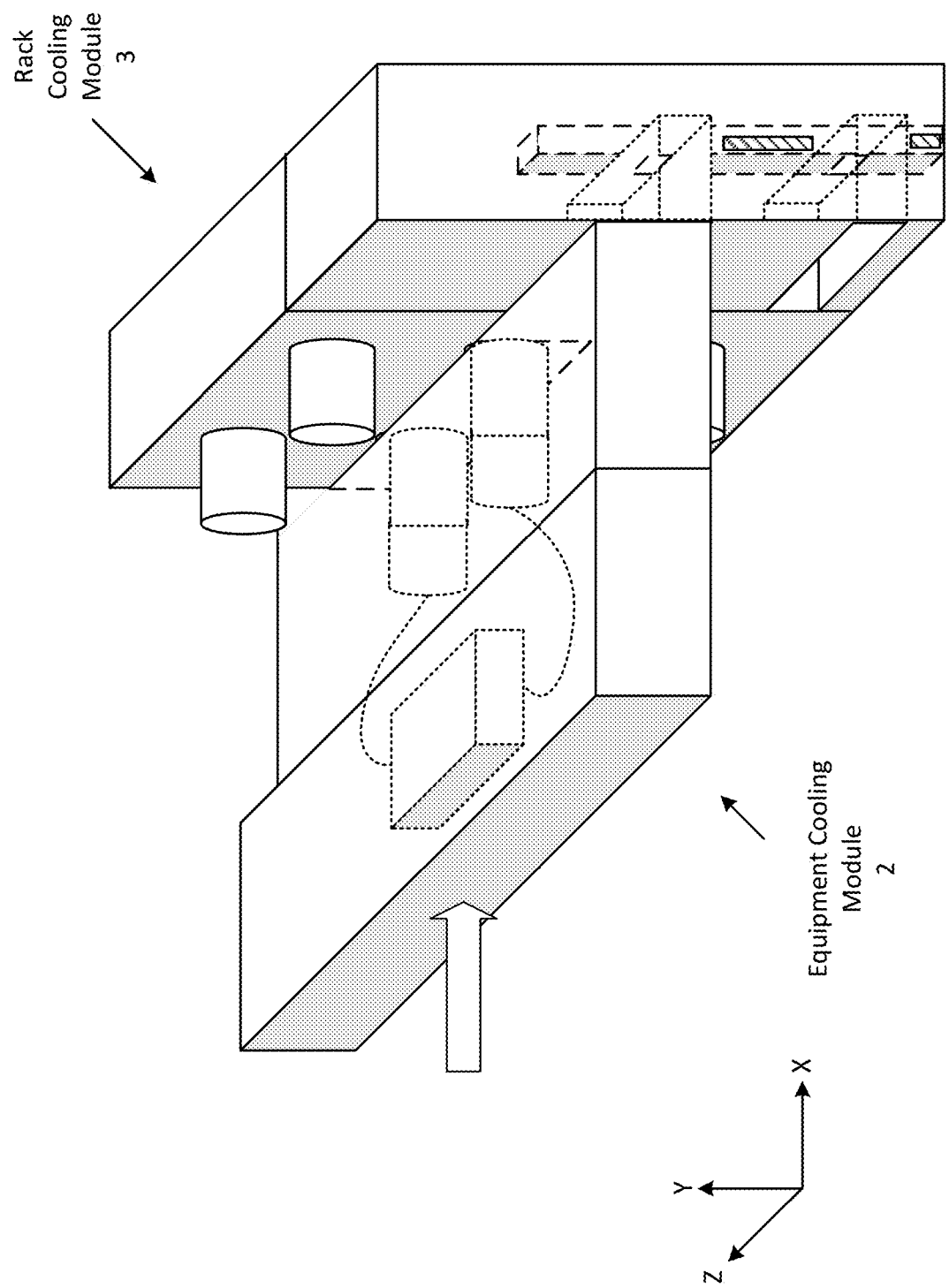
FIG. 2 shows the equipment cooling module coupling to the rack cooling module according to one embodiment.

FIG. 2 shows the equipment cooling module coupling to the rack cooling module according to one embodiment. Specifically, the equipment module is arranged to couple to the rack module by the pair of supply and return connectors of the equipment module coupling to respective manifold connectors, and the conducting structure being inserted into the detection section. As shown, the equipment module 2 has moved (e.g., along the X-axis) and has coupled to the rack module, such that the supply and return manifold connectors 24 and 25 are coupled to the supply and return connectors 11 and 12, respectively. In particular, the manifold connectors have been received through the connector opening 13 and have coupled to the connectors of the equipment module. As a result, when the equipment module is coupled to the rack module, a heat exchanging loop is created in which the rack module circulates liquid coolant through the equipment module (e.g., via the manifold connectors). In addition, at least a portion of the conducting structure 9 is insertable coupled into a detection section opening 26 such that the conducting structure opening 15 opens into the leak detection channel, when the equipment module is coupled to the rack module. Specifically, the conducting structure is received through a detection section opening and into its receiving channel 27, which allows the conducting structure (e.g., opening 15) to be fluidly coupled with the (e.g., leak detection channel opening 30 of the) leak detection channel 28. Thus, if a leak occurs within the equipment cooling module 2, liquid coolant may flow through the conducting structure, out the conducting structure opening and into the leak detection channel 28. Once within the channel, the liquid may come into contact with the leak detection sensor, which as a result may detect the presence of the liquid, as described herein.

As shown, the leak segregation structure 8 (e.g., entirely) surrounds the manifold connectors when coupled to the rack module. In particular, when coupled, a front end of the equipment module abuts (or comes into contact) with a frontend surface of the rack module. By coming into contact with the rack module prevents (or minimizes) leaking liquid from spilling out and onto the frontend surface of the rack module.

In one embodiment, the detection section opening and the receiving channel are sized to receive the conducting structure, as shown. In some embodiments, the receiving channel may have a length (e.g., a distance between the detection section opening 26 and the leak detection channel opening 30) that is similar or the same as a length of the conducting structure.

Figure 3:
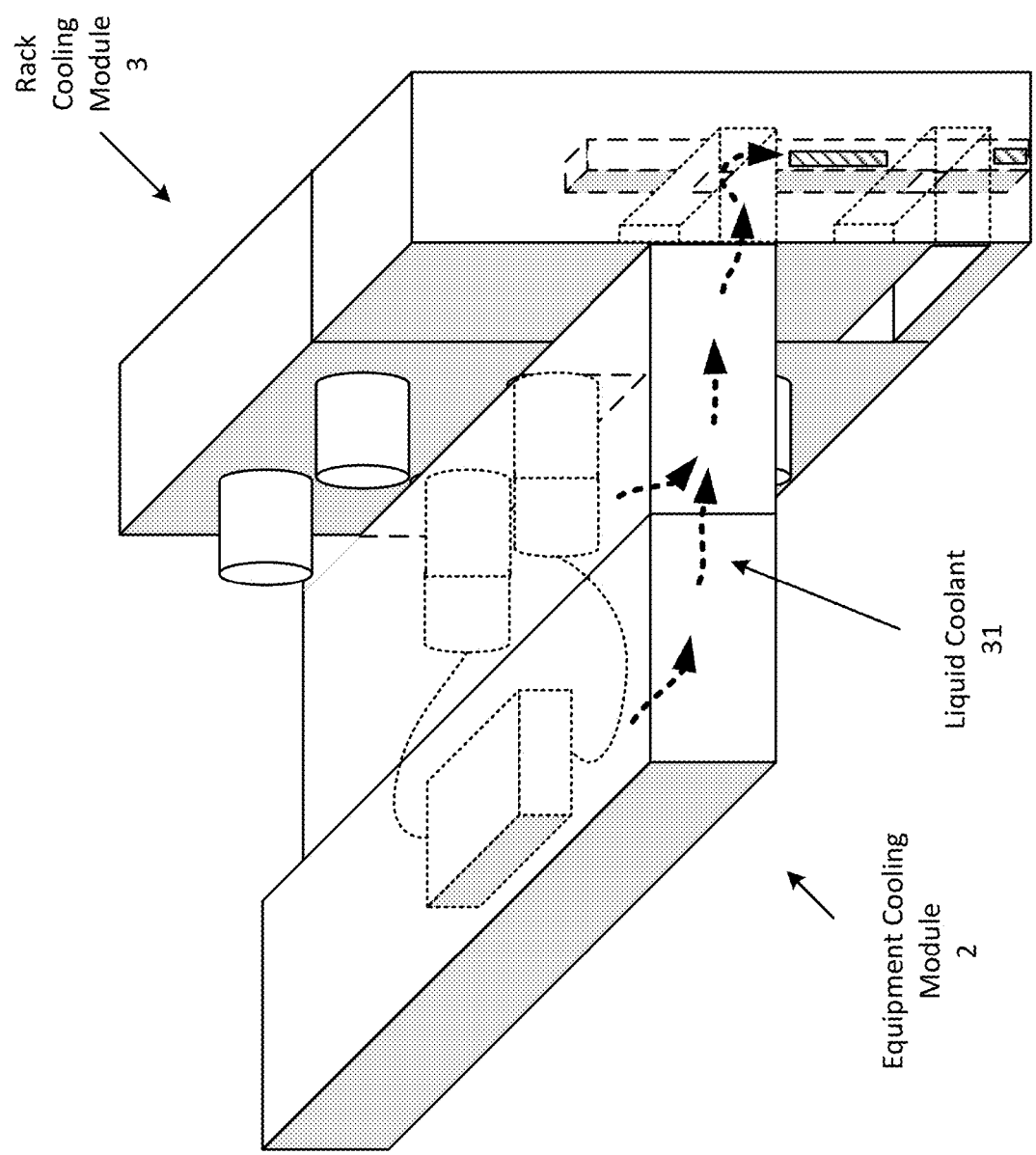
FIG. 3 shows liquid coolant that is leaking within the equipment cooling module flowing into the detection section of the rack cooling module according to one embodiment.

FIG. 3 shows liquid coolant that is leaking within the equipment cooling module flowing into the detection section of the rack cooling module according to one embodiment. Specifically, this figure is showing a path along which liquid coolant that is leaking within the equipment module 2 travels through the module and into the rack module 3. As shown, liquid coolant 31 is leaking from the cold plate 7 (e.g., a connector of the cold plate that is coupled to a line that couples the cold plate to the supply connector 11), and is leaking from the supply connector 11. In one embodiment, liquid coolant may leak for various reasons, such as wear and tear or may leak due to connectors not creating a sufficient seal. As a result, the leaking liquid coolant 31 flows from the cooling chassis 4 and the leak segregation chassis, and into the conducting structure 9. The liquid coolant than travels through the structure, and into the leak detection channel 28 through openings 15 and 30. Once the liquid coolant enters the channel and makes (at least partial) contact with a leak detection sensor 29, the leak segregation and detection system may receive a control signal from the sensor indicating that there is a leak. More about detecting a leak is described herein.

In one embodiment, the liquid coolant may flow into (and out of) the conducting structure 9 based on the structural design of the equipment module. For example, at least a portion of the (interior) bottom may taper toward the conducting structure opening, such that liquid flows (using gravity) out of the equipment module.

Figure 4:
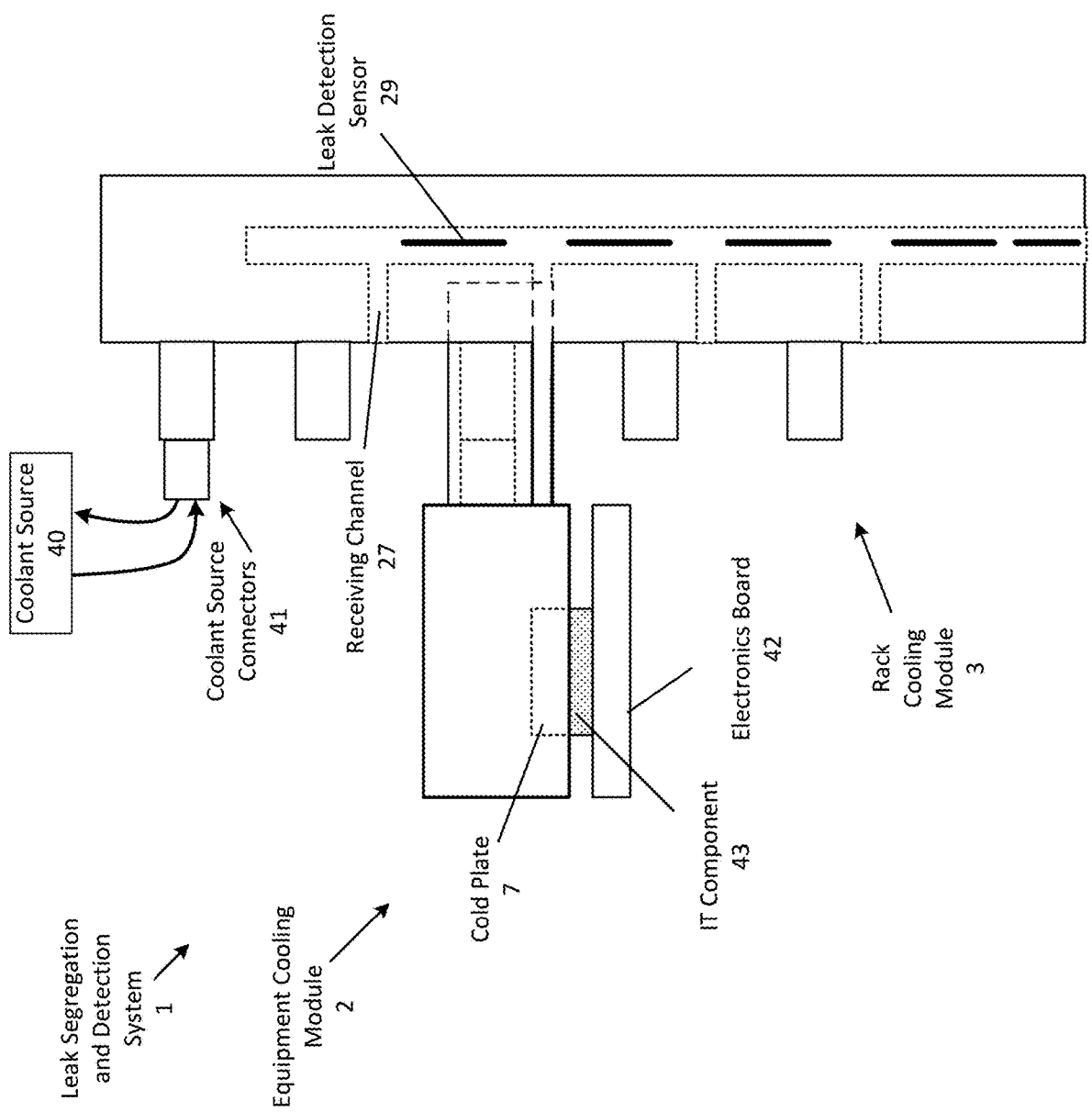
FIG. 4 shows a side view of the equipment cooling module coupled to the rack cooling module according to one embodiment.

FIG. 4 shows a side view of the leak segregation and detection system 1 that includes the equipment cooling module 2 coupled to the rack cooling module 3 according to one embodiment. Specifically, this figure shows a side view of the detection section, and shows manifold connectors 24 and 25, and the main supply and return connectors 22 and 23, which are coupled to the manifold section (that is positioned behind the detection section). As shown, an electronics board 42 includes a IT component 43 (e.g., that is mounted on the board). In some embodiments, the board 42 may include one or more IT components (e.g., central processing units or CPUs, graphical processing units (GPUs), memory, and/or storage devices). The IT component may perform data processing tasks, where the IT component may include software installed in a storage device, loaded into the memory, and executed by one or more processors to perform the data processing tasks. In one embodiment, the electronics board may include a host server (referred to as a host node) coupled to one or more compute servers (also referred to as computing nodes, such as CPU server and GPU server). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the performance computing nodes or compute servers (having one or more GPUs) managed by the host server. The performance compute servers (e.g., the IT component) perform the actual tasks, which may generate heat during the operations. This heat needs to be transferred away from the component in order to ensure that the component performs properly (e.g., does not overheat).

As shown, along with being coupled to the rack cooling module, the equipment cooling module is also coupled to (or mounted on) the (e.g., one or more IT components 43 of the) electronics board 42. Thus, as described herein, the cold plate 7 of the equipment cooling module may draw heat away from the (IT component mounted on the) electronics board while the electronics board (and at least one IT component mounted thereon) is in operation (e.g., drawing power to perform one or more computational operations), and transfer the heat into liquid coolant that is circulating through the cooling module in order to liquid cool the IT component(s).

This figure also shows a coolant source 40 that is coupled to the rack cooling module 3. Specifically, the coolant source is coupled via coolant source connectors (e.g., supply and return connectors) 41 to the main supply and return connectors 22 and 23. In one embodiment, the coolant source may an IT liquid cooling water system or any type of cooling fluid source. In another embodiment, the coolant source may be a source that is separate from the electronics rack, or may be a source within the rack. For example, the coolant source may be a heat exchanger that is mounted within the electronics rack, such as heat exchanger 513 in FIG. 8.

Also shown are multiple leak detection sensors 29 that are stacked within the leak detection channel 28. In one embodiment, the detection section 21 may include at least one sensor for each receiving channel 27, such that when an equipment cooling module 2 is coupled to the rack module 3, at least one sensor will be disposed within the channel to detect whether or not the equipment is leaking. Thus, with the detection section includes at least four sensors, one for each of the four receiving channels. Each receiving channel's respective sensor is disposed below the channel (in the vertical direction). In one embodiment, a leak detection sensor may be arranged to detect a presence of liquid coolant that flows from a detection section opening 26 (or leak detection channel opening 30) that is positioned adjacent to (or above) the sensor. For example, the second leak detection sensor 29 within the stack of sensors is arranged to detect a presence of liquid that flows from the (e.g., conducting structure of the) equipment module that is illustrated as coupled to the rack module in this figure. In another embodiment, a leak detection sensor may be arranged to detect a presence of liquid that flows through the channel from a portion of the channel that is above the (e.g., opening that is above the) sensor. For example, the second leak detection sensor is arranged to detect liquid coolant that enters the channel through the top-most receiving channel 27, and travels downward through the channel, making contact with the sensor. In some embodiments, at least some of the sensors may be arranged to detect liquid coolant flowing into one or more openings of the detection section and/or flowing through the channel. In another embodiment, the sensor may be positioned differently. For example, at least some sensors may be disposed adjacent to a receiving channel's leak detection channel opening 30.

In one embodiment, any of the connectors described thus far may be any type of connector arranged (or designed) to removably couple to other connectors. For example, the connectors may be any type of liquid connectors, which when two connectors are coupled together liquid may flow between the connectors. In some embodiments, at least some of the connectors may be dripless blind mating quick disconnects.

As described thus far, the equipment cooling module may have a pair of supply and return connectors (e.g., connectors 11 and 12), while the rack cooling module may also have a pair of respective supply and return manifold connectors (e.g., connectors 24 and 25). In one embodiment, either of the modules may have more or less supply and/or return connectors. For example, the equipment cooling module may have two pairs of supply and return connectors, which may allow the module to have two separate (e.g., one being redundant) heat exchanging loops). As a result, the equipment cooling module may be arranged to couple to two pairs of supply manifold connectors.

In one embodiment, the leak segregation system 1 may be a single-phase liquid cooling system in which liquid coolant (which may be a single-phase liquid coolant) that the rack cooling module circulates through the equipment cooling module may does not boil or undergo a phase change as the equipment cooling module transfers heat away from the electronics board and into the liquid coolant. In another embodiment, the system 1 may be a phase-change (or two-phase) cooling system, in which the cold plates of the equipment cooling module produces vapor from the liquid coolant flowing through the plates when heat generated by (e.g., the IT components of) the electronics board is transferred into the liquid coolant by the cold plate. In which case, the vapor may be then returned to the coolant source, which may condense the vapor back into liquid coolant, which is then fed back into the equipment cooling module by the rack cooling module.

Figure 5:
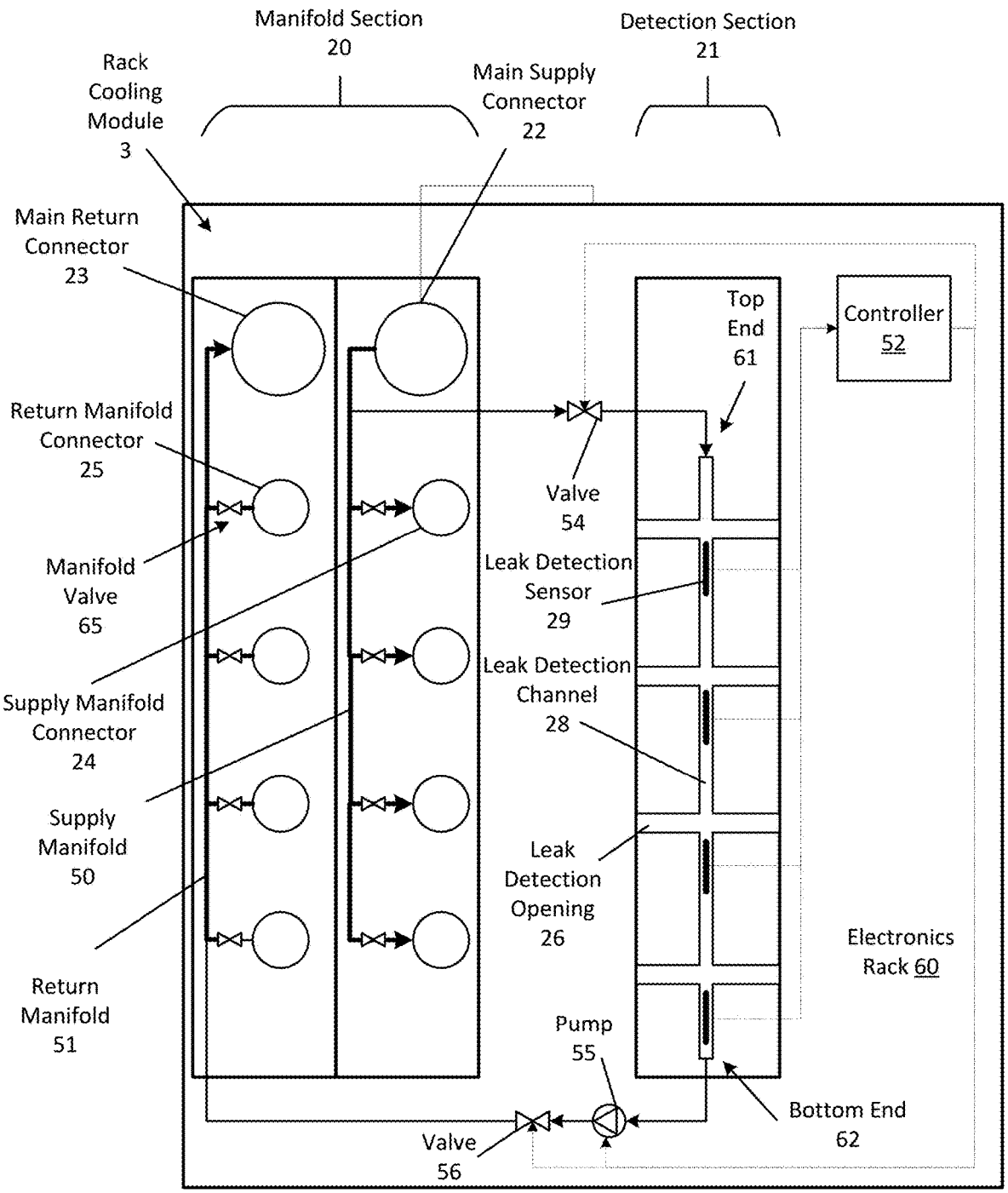
FIG. 5 shows another example of the rack cooling module within an electronics rack according to one embodiment.

FIG. 5 shows an example in which the rack cooling module 3 is within an electronics rack 60 according to one embodiment. Specifically, this figure is showing a front view of the rack cooling module 3 that includes the manifold section 20, the detection section 21, a controller 52, a valve 54, a pump 55, and a (optional) valve 56. In one embodiment, (at least some of) these elements may be contained within (e.g., a frame or housing of) the electronics rack 60. In some embodiments, the rack module may include more or less elements, such as not having the optional valve 56.

The manifold section 20 includes a supply manifold 50 that is coupled to each supply manifold connector 24, and is arranged to receive liquid coolant from the main supply connector 22 (e.g., received from a coolant source, such as source 40 in FIG. 4) and supply the liquid coolant to at least some of the supply manifold connectors. The manifold section also includes a return manifold 51 that is coupled to each return manifold connector 25 and the main return connector 23, and is arranged to receive (e.g., warmed) liquid coolant from (at least one of) the return manifold connectors (e.g., received from one or more cold plates of one or more equipment modules 2 coupled to the rack module 2) and to provide (return) the warmed liquid coolant to the coolant source (via the main return connector 23).

As shown, the valve 54 couples the supply manifold 50 to the leak detection channel 28. In particular, the valve is coupled to a top end 61 of the channel (via a line). In one embodiment, the top end may be a part of the channel that is above a top-most detection section opening 26. In another embodiment, the valve 54 may couple to a point along the channel that is above a top-most leak detection sensor 29, of one or more sensors (e.g., the 4 sensors shown herein) that are stacked within the channel. Also shown, the valve 54 couples (via a line) to the supply manifold 50 between the main supply connector 22 and the top-most supply manifold connector 24 (e.g., the manifold connector of the stack of connectors that is closest to the main supply connector).

The pump 55 couples the leak detection channel 28 to the return manifold 51. Specifically, the pump is coupled to a bottom end 62 of the channel. In some embodiments, the bottom end may be below the bottom-most leak detection sensor 29 that is disposed within the channel. In one embodiment, all of (or at least some of) the leak detection sensors are disposed between the top and bottom ends of the channel. In addition, the optional valve 56 is coupled between the pump 55 and the return manifold.

The manifold section 20 also includes manifold valves 65 which couple each of the manifold connectors to their respective manifolds. Specifically, each of the supply manifold connectors 24 is coupled to the supply manifold 50 via a valve, and each of the return manifold connectors 25 is coupled to the return manifold 51 via a valve. In one embodiment, these valves may be communicatively coupled to the controller, and configured to open or close based on control signals received by the controller. In one embodiment, a portion of the manifold connectors may include the valves. In one example, only the supply manifold connectors may be coupled to the valves, whereas the return manifold connectors may couple (e.g., directly) to the return manifold.

The controller 52 may be a special-purpose processor such as an application-specific integrated circuit (ASIC), a general purpose microprocessor, a field-programmable gate array (FPGA), a digital signal controller, or a set of hardware logic structures (e.g., filters, arithmetic logic units, and dedicated state machines). In one embodiment, the controller may be a circuit with a combination of analog elements (e.g., resistors, capacitors, inductors, etc.) and/or digital elements (e.g., logic-based elements, such as transistors, etc.). The controller may also include memory. In one embodiment, the controller may be a part (or integrated) into the rack cooling module (e.g., a part of the detection section 21). In another embodiment, it may be separate. As shown, the controller is included within the rack (e.g., a part of one or more electronics boards housed within the rack). In another embodiment, the controller may be separate from the rack (e.g., within another electronics rack).

In one embodiment, the controller 52 is communicatively (or electrically) coupled (e.g., wired and/or wirelessly connected) to at least some of the components of the rack cooling module 3. Specifically, as shown, the controller is communicatively coupled to each of the leak detection sensors 29, the pump 55, and the valves 54 and 56. The controller is configured to receive (e.g., electrical) control signals from the sensors that may indicate a presence of liquid (coolant) within the leak detection channel 28. For instance, in response to liquid coming (at least partially) in contact with a (e.g., leak detection cable of the) sensor 29, the sensor may produce and transmit one or more signals to the controller indicating that liquid is present.

The controller is configured to control the pump and/or one or more valves. Specifically, the controller may be configured to transmit control signals to electronics of the components in order to control them. For example, the controller is configured to transmit a control signal to (e.g., electronics of) valve 54 to open or close the valve. In another embodiment, the controller may be configured to control an opening ratio of the valve (e.g., causing the valve to open halfway). In another embodiment, the controller may be configured to control the pump (e.g., activate/deactivate the pump, adjust a pump speed of the pump, etc.). As described herein, the controller may be configured to activate the pump in order to draw liquid from the channel and push the liquid into the return manifold 51. More about controlling the pump is described herein.

In one embodiment, the rack cooling module 3 may include one or more additional valves (not shown) that are configured to control a flow of liquid coolant that circulates through one or more equipment cooling modules that are coupled to the rack module. For example, each pair of supply and return manifold connectors may include one or more valves that couple the connectors to their respective manifolds. For instance, a valve may couple a supply manifold connector 24 to the supply manifold 50 and/or another valve may couple a return manifold connector 25 to the return manifold 51. Each of these valves may be communicatively coupled to the controller 52, which may be configured to control whether the valves are open or closed. More about these valves is described herein.

In one embodiment, at least some of the components described herein may be removably coupled to one another. For example, the valve 54 may be removably coupled to the supply manifold and the channel 28. In another embodiment, the leak detection sensors may be disposed within the channel, and may be arranged to be removed from the channel (e.g., during servicing of the rack cooling module). For instance, the channel may include one or more access points at which a technician may be able to add or remove sensors from the channel.

The controller 52 may be configured to perform one or more leak segregation and detection operations describe herein by operating in one of one or more operational modes. For example, the controller may be configured to operate in a sensor service mode in which the controller determines whether one or more of the leak detection sensors 29 of the detection section are functioning normally (e.g., are detecting a presence of liquid). To do this, the controller may open the valve 54 to allow liquid coolant to flow from the supply manifold 50 into the channel. As the liquid coolant enters and flows through the channel it comes into contact with one or more sensors disposed therein. The controller is configured to determine whether sensors are functioning normally based on whether one or more sensors indicate a presence of liquid (e.g., based on whether the controller receives control signals from the sensors). More about this mode is described in FIG. 6.

In another embodiment, the controller may be configured to operate in a leakage detection mode in which the controller determines whether there is a liquid coolant leak in one or more equipment cooling modules that are coupled to the rack cooling module. As described in FIG. 3, leaking liquid coolant flows from the equipment module and into the leak detection channel 28, where it comes into contact with one or more sensors 29. Upon making contact, the controller may determine that there is a leak. In one embodiment, to remove the liquid from the channel the controller may be configured to activate the pump in response to receiving a control signal from a sensor. More about this mode is described in FIG. 7.

Figure 6:
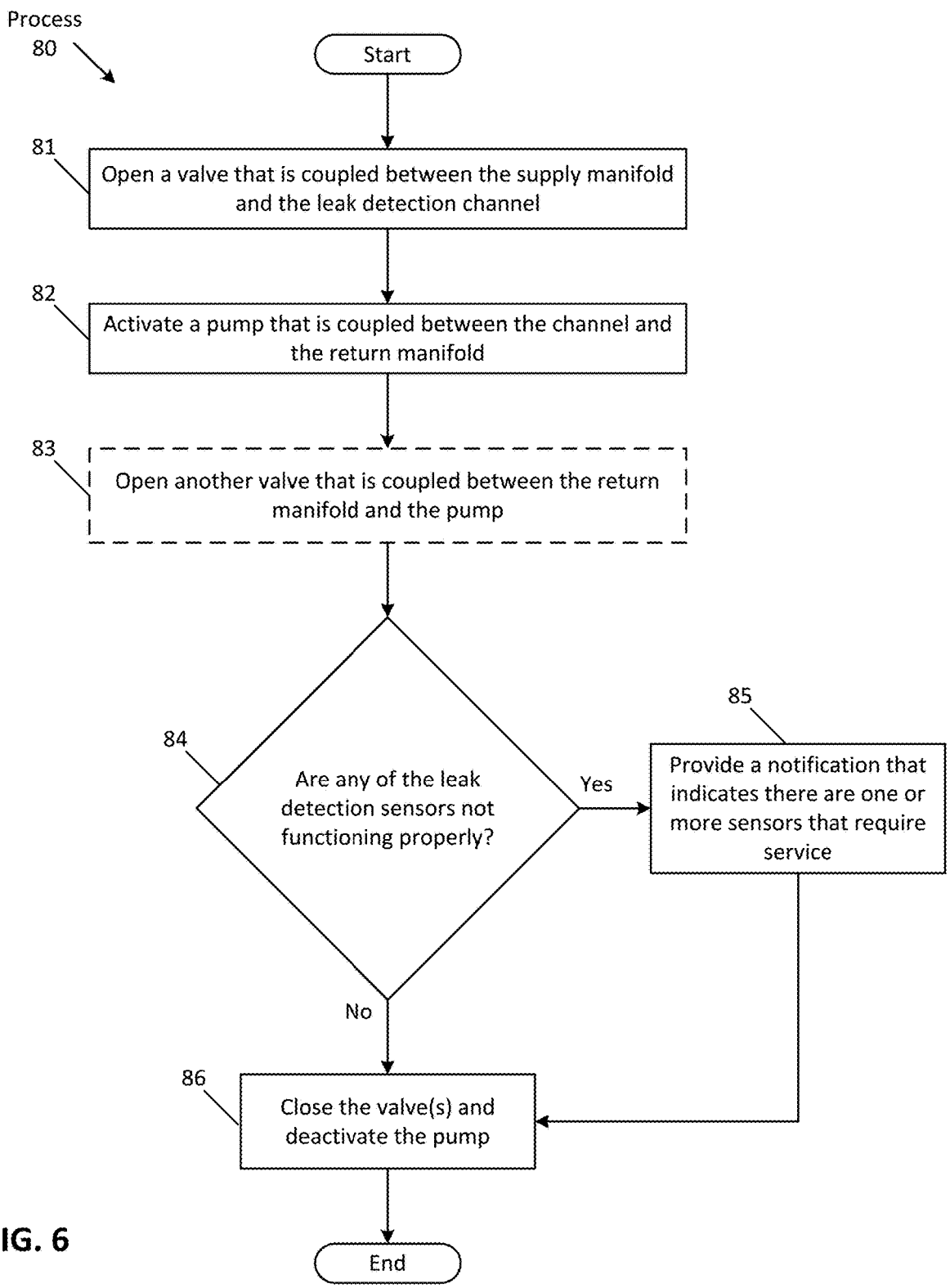
FIG. 6 is a flow chart of a process for servicing leak detection sensors of a leak segregation and detection system according to one embodiment.

FIG. 6 is a flow chart of a process 80 for servicing leak detection sensors 29 of a leak segregation and detection system 1 according to one embodiment. In one embodiment, at least some of the operations of the process 80 may be performed by the controller 52, while the controller is operating in the sensor service mode. In some embodiments, the controller may perform this process in response to user input (e.g., input into a user electronic device that is communicatively coupled to the controller). In another embodiment, the controller may perform this process automatically (e.g., without user intervention). For instance, the controller may perform at least some of these operations periodically (e.g., once a week), and while the system is providing liquid cooling to one or more equipment modules that are coupled to the rack module.

The process 80 begins by the controller opening a valve (e.g., valve 54) that is coupled between the supply manifold 50 and the leak detection channel 28 of the detection section 21 (at block 81). For instance, the controller may transmit a control signal to the valve 54 to open to allow liquid coolant that is being received from a coolant source by the supply manifold to flow into the channel. In one embodiment, the valve 54 may be normally closed (e.g., while equipment modules that are coupled to the rack module are being liquid cooled).

The controller 52 activates a pump that is coupled between the channel and a return manifold (at block 82). Specifically, the controller may activate pump 55 so that liquid coolant that is flowing through the channel may circulate back into the return manifold 51 and to the coolant source from which it came. In one embodiment, the controller may activate the pump after a period of time (e.g., a predefined period of time that it takes for liquid coolant to flow to the bottom end 62 of the channel). In another embodiment, the pump may be activated in response to the controller receiving one or more control signals from one or more sensors 29. For instance, the controller may activate the pump in response to a bottom-most sensor (e.g., the sensor closest to the bottom end 62) transmitting a signal to the controller indicating that liquid has reached the bottom of the channel. The controller opens another valve that is coupled between the return manifold and the pump (at block 83). For example, the controller may open valve 56. In one embodiment, the controller may open this valve before activating the pump 55. In another embodiment, this operation is optional. Specifically, the controller may not perform this operation is the system does not include the valve 56 or may not open the valve if it is already open.

The controller determines if there are any leak detection sensors not functioning properly (at decision block 84). Specifically, the controller determines whether sensors are functioning properly by opening the valve 54 such that liquid coolant is allowed to flow from the supply manifold and into the channel, and determine whether there are any sensors that are not transmitting a control signal to the controller that indicates a presence of liquid within the channel. In another embodiment, a determination of whether or not a sensor is functioning properly may be based on the quality of the signal being received by the controller. For instance, since the sensors are disposed within the vertical channel, any liquid that flows through the channel flows from top (e.g., the top end 61) to the bottom (e.g., the bottom end 62). Therefore, liquid coolant flowing through the channel will (most likely) come into (at least some) contact with sensors disposed in between the ends. If all sensors are functioning properly (e.g., all sending a control signal), the controller closes the valves and deactivates the pump (at block 86). In one embodiment, the controller may perform these operations at once or one at a time. For example, the controller may close valve 54, and after a period of time deactivate the pump in order to remove all remaining liquid within the channel. Once the pump is deactivated, the valve 56 (if present) may be closed.

If, however, at least one sensor is not functioning properly (e.g., not sending a signal), the controller provides a notification that indicates there are one or more sensors that require service (at block 85). Specifically, the notification may indicate which sensors (of the stack of sensors disposed within the channel) need to be serviced (e.g., need to be replaced with new sensors). For example, the controller may provide an audible alert, by playing back a notification through one or more speakers that are coupled to the controller. As another example, the controller may provide a (e.g., pop-up) notification through a display screen that is coupled to the controller. In one embodiment, the controller may provide the notification through other means, such as transmitting an electronic message (e.g., an e-mail) to a user device.

In one embodiment, the process 80 may be (at least partially) performed while one or more equipment cooling modules 2 are coupled to the rack cooling module 3. Specifically, these operations may be performed while equipment modules are being used to liquid cool IT components of electronics boards. As a result, sensors may be serviced without interrupting the computational operations of IT components that are being liquid cooled by equipment modules.

Figure 7:
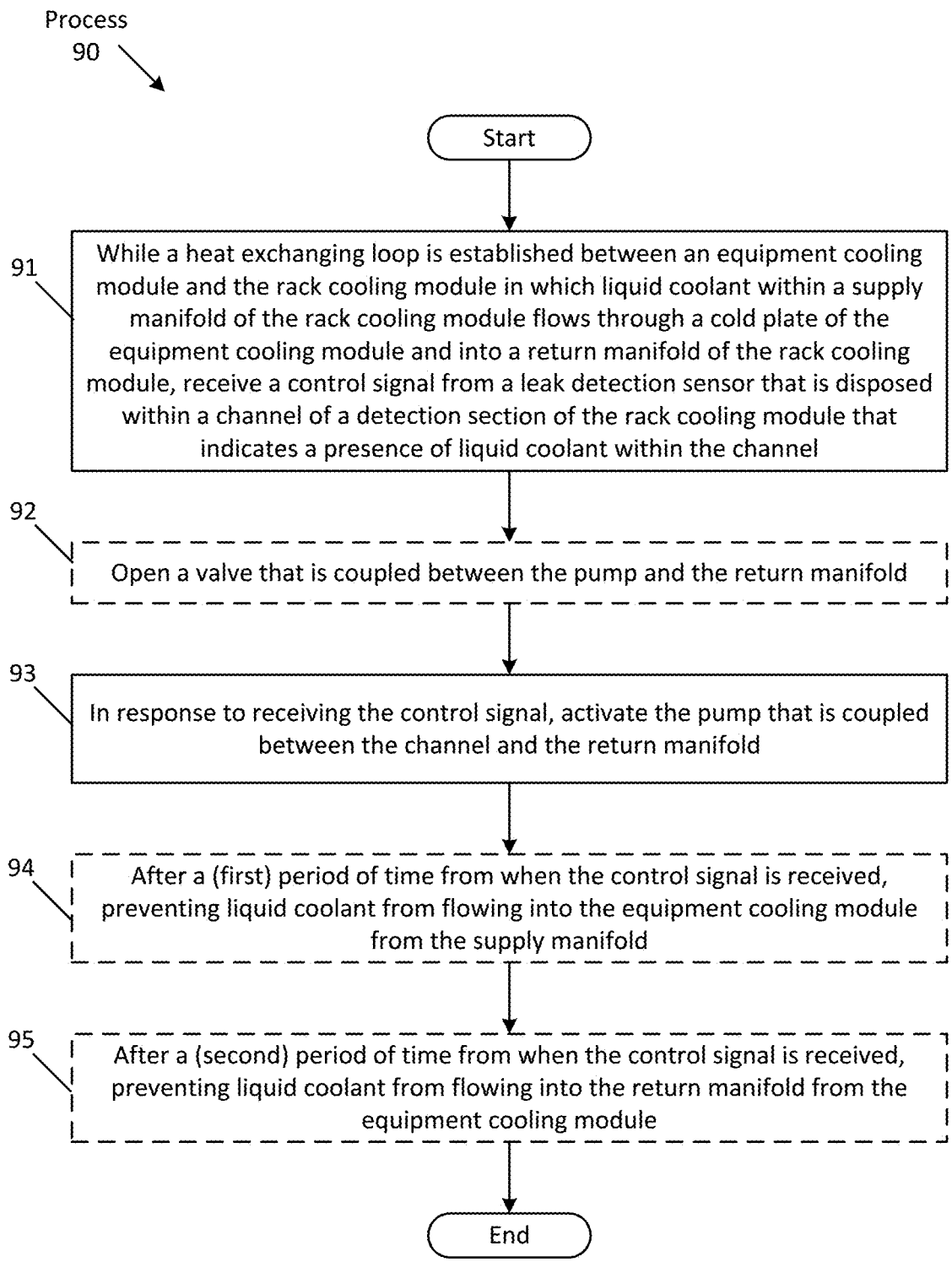
FIG. 7 is a flow chart of a process for controlling the leak segregation and detection system upon detecting a leak of liquid coolant according to one embodiment.

FIG. 7 is a flow chart of a process 90 for controlling the leak segregation and detection system 1 upon detecting a leak of liquid coolant according to one embodiment. In one embodiment, at least some of the operations of process 90 may be performed by the controller 52, while the controller is in the leakage detection mode. Specifically, the controller may operate in this mode while the (e.g., one or more equipment cooling modules of the) leak segregation and detection system 1 is used to liquid cool IT components of one or more electronics boards mounted within an electronics rack. Thus, the operations may be performed while the IT components are normally operating (e.g., performing computational operations).

The process 90 begins by the controller, while a heat exchanging loop is established between an equipment cooling module and the rack cooling module in which liquid coolant within a supply manifold of the rack cooling module flows through a cold plate of the equipment cooling module and into a return manifold of the rack cooling module, receives a control signal form a leak detection sensor that is disposed within a channel of a detection section of the rack cooling module that indicates a presence of liquid coolant within the channel (at block 91). In one embodiment, the control signal may be received from one or more sensors of the detection section based on a liquid coolant leak of one or more equipment cooling modules that are coupled to the rack cooling module.

In one embodiment, the heat exchanging loop may be established once the equipment cooling module is coupled to the rack cooling module (e.g., once the supply and return connectors of the equipment module couple to manifold connectors of the rack cooling module). In another embodiment, the controller may be configured to establish the heat exchanging loop. For instance, manifold valves 65 that couple manifold connectors to their respective manifolds may be closed, while no equipment module is coupled to the manifold connectors. Once the equipment module is coupled, the controller may be configured to open valves of the manifold connectors in order to circulate liquid coolant through the coupled equipment module.

The controller (optionally) opens a valve that is coupled between the pump and the return manifold (at block 92). For instance, if the rack cooling module includes valve 56, and it is closed, the controller is configured to open the valve 56 in order to allow liquid that is to be pumped by pump 55 to be received by the return manifold 51. In response to receiving the control signal, the controller activates the pump that is coupled between the channel and the return manifold (at block 93). For instance, the pump may be activated in response to the controller receiving a first (or initial) control signal from one or more sensors. In another embodiment, the pump may be activated in response to the controller receiving a signal from a bottom-most sensor, indicating that liquid has reached a bottom of the channel, as described herein.

By drawing the leaking liquid out of the channel and back into the return module, the equipment module of the leak segregation and detection system may continue to operate normally. Specifically, even though a leak is detected, liquid coolant continues to be supplied to the equipment module to maintain the heat exchanging loop in order to allow the equipment module to continue to perform computational operations without interruption. This is due to the fact that fluid continues to be supplied through the supply manifold, and at least a portion of warmed liquid coolant is returned to the return manifold via the return manifold connectors and/or the detection section. In some embodiments, even though a leak has occurred, the system may continue to operate normally indefinitely. In another embodiment, the system may operate this way until the workload of the leaking equipment module has been offloaded, as described herein.

In one embodiment, the controller may be configured to determine at which equipment cooling module the leak has occurred. For example, referring to FIG. 5, upon receiving a signal from the top-most leak detection sensor, the controller may determine that a leak has occurred within an equipment cooling module that is coupled to the top-most manifold connectors 24 and 25 and the top-most leak detection opening 26. With a leak occurring within the equipment module, the controller may be configured to shut down the flow of liquid coolant through the equipment in order to control the leak. Thus, after a (first) period of time from when the (e.g., initial) control signal is received, the controller (optionally) prevents liquid coolant from flowing into the equipment cooling module from the supply manifold (at block 94). For instance, the controller may close the manifold valve 65 that is coupled to the supply manifold connector 24 associated with the equipment module. In one embodiment, the period of time may be predefined. In some embodiments, the period of time may allow the (e.g., controller of the) electronics rack to migrate computational operations (work load) that are being performed by IT components of an electronics board that are being liquid cooled by the equipment module to another one or more electronics boards, which may be liquid cooled by other equipment modules. In one embodiment, the controller may prevent the flow of liquid in response to determining that the computational operations have been fully migrated. After a (second) period of time from when the control signal is received, the controller prevents (optionally) liquid coolant from flowing into the return manifold from the equipment cooling module (at block 95). In particular, the controller may close the manifold valve 65 associated with the return manifold connector 25 associated with the equipment module. In one embodiment, the valve of the return manifold connector may be closed after a period of time from when the valve of the supply manifold connector was closed.

Some embodiments may perform variations of the processes described herein. For example, the specific operations of the processes may not be performed in the exact order shown and described. The specific operations may not be performed in one continuous series of operations and different specific operations may be performed in different embodiments. For example, several blocks described herein are illustrated as having dashed boundaries. In one embodiment, the operations described within these blocks may be optional. For example, the operations performed in blocks 94 and 95 are optional (e.g., system may continue to provide a heat exchanging loop for an equipment module that is leaking).

In one embodiment, the controller may cease operating in the leak incident mode, once a leak is no longer detected within the system. For example, the controller may determine whether any of the sensors cease to produce signals that indicate a presence of liquid. If all or at least one of the sensors (e.g., the bottom-most sensor) ceases to produce the signal, which indicate that liquid is no longer present, the controller may return the system back to a state from before performing the process 90. For instance, the controller may (optionally) close valve 56, and may deactivate the pump 55. In another embodiment, the controller may perform at least some of these operations in response to user input.

In another embodiment, the controller may prevent liquid coolant from flowing into (and out of) the equipment module differently than described herein. As described herein, the controller may close a manifold valve 65 associated with a supply manifold connector of a leaking equipment module after a first period of time, and then may close a manifold valve associated with a return manifold connector of the leaking module after another period of time. In another embodiment, the controller may close the valves differently. For example, once the pump is activated, the controller may immediately (e.g., once the control signal is received), close the manifold valve associated with the supply manifold connector, and after a period of time close the manifold valve associated with the return manifold connector. As another example, the controller may keep both valves open for a period of time, and then close both manifold valves at (or approximately at) the same time. Any fluid remaining within the equipment module may leak into the detection section.

FIG. 8 is an example of an electronics rack that includes a leak segregation and detection system, such as system 1, according to one embodiment. Electronics rack 500 may include one or more server slots to contain one or more electronics boards, such as servers, respectively. In one embodiment, each server includes one or more IT components (e.g., processors, memory, storage devices, network interfaces). According to one embodiment, electronics rack 500 includes, but is not limited to, CDU 523, rack management unit (RMU) 502 (optional), a power supply unit (PSU) 550, and one or more electronics boards (or IT equipment) 507A-507D, which may be any type of IT equipment, such as server blades. The IT equipment 507 can be inserted into an array of server slots respectively from frontend 503 or backend 504 of electronics rack 500. In one embodiment, the electronics boards 507A-507D may be the same as the electronics board 42, as shown in FIG. 4, for example.

Note that although there are only four electronics boards 507A-507D shown here, more or fewer electronics boards may be maintained within electronics rack 500. Also note that the particular positions of CDU 523, RMU 502, PSU 550, and IT equipment 507 are shown for the purpose of illustration only; other arrangements or configurations of these components. may also be implemented. Note that electronics rack 500 can be either open to the environment or partially contained by a rack container, as long as the cooling fans can generate airflows from the frontend to the backend (or generate airflows from the backend to the frontend).

As described herein, the electronics rack includes the leak segregation system 1. Specifically, the electronics rack 500 includes (e.g., contained within) the rack cooling module 3 and four equipment cooling modules 2a-2d that are coupled to the rack cooling module. In addition, each cooling module is coupled to (or mounted on) a respective electronics board. As a result, each equipment cooling module may liquid cool its respective electronics board, while any leaking liquid is segregated from a remainder of the electronics rack. For instance, if a leak were to occur in the equipment cooling module 2a, the leak segregation system segregates the leak such that (at least) the remainder of the electronics boards 507b-507d are unaffected by the leak.

In addition, a fan module can be associated with each of the electronics boards 507, and the PSU module. In this embodiment, fan modules 531a-531e, collectively referred to as fan modules 531, and are associated with the electronics boards 507a-507d and the PSU, respectively. Each of the fan modules 531 includes one or more cooling fans. Fan modules 531 may be mounted on the backends of (at least some of) the electronics boards 2 to generate airflows flowing from frontend 503, traveling through the rack 500, and existing at backend 504 of electronics rack 500. In some embodiments, at least some of the fans may be mounted to the backend 504 of the electronics rack 500. In another embodiment, one or more of the fan modules may be positioned on the frontend 503 of the rack 500. Such frontend fans may be configured to push air into the mounted equipment.

In one embodiment, CDU 523 mainly includes heat exchanger 513, liquid pump 514, and a pump controller (not shown), and some other components such as a liquid reservoir, a power supply, monitoring sensors and so on. Note that the CDU may be any kind of CDU commercially available or customized ones. Thus, the details of CDU will not be described herein. Heat exchanger 513 may be a liquid-to-liquid heat exchanger. Heat exchanger 513 includes a first loop with inlet and outlet ports having a first pair of liquid connectors coupled to external liquid supply/return lines 532 and 533 to form a primary loop. The connectors coupled to the external liquid supply/return lines 532 and 533 may be disposed or mounted on back end 504 of electronic rack 500. The liquid supply/return lines 532 and 533 are coupled to a set of room manifolds, which are coupled to an external heat removal system, or extremal cooling loop. In addition, the heat exchanger 513 further includes a second loop with (additional) inlet/outlet ports fluidly coupled to the main supply and return connectors 22 and 23 in order to circulate and cool liquid coolant through the rack cooling module. As described herein, the rack cooling module may include one or more leak detection sensors 29. In one embodiment, at least some sensors may be communicatively coupled to equipment within the electronics rack, which may be configured to perform liquid detection operations. For example, the sensors may be communicatively coupled with the CDU, which when receiving a control signal from a sensor that indicates a presence of liquid coolant (e.g., a leak) may perform one or more operations. For instance, the CDU may produce an alert (e.g., via a computer terminal) that indicates that a leak is present within the rack cooling module and may accurately report which electronics rack and/or at which equipment cooling module a leak has occurred. In another embodiment, the leak detection sensor may be communicatively coupled with any electronics boards 507 or a controller (e.g., controller 52) of the electronics rack that is configured to perform leak detection operations. In some embodiments, the rack cooling module 3 may couple (e.g., directly) to the external liquid supply/return lines 532 and 533. In which case, the electronics rack may not use (or having) at least some of the elements described herein, such as the CDU 523.

In another embodiment, the flow of liquid into one or more equipment cooling modules may be adjusted based on a detected leak. For example, the rack cooling module may include one or more components that are designed to control the flow of liquid, such as one or more valves. In which case, each manifold connector may be coupled to a valve. Thus, in response to detecting a leak, the electronics rack may be configured to close values of manifold connectors that are associated with the leak (e.g., associated with the opening at which the leak was detected).

Each of the electronics boards 507 include one or more IT components (e.g., component 43 shown in FIG. 4), such as central processing units or CPUs, graphical processing units (GPUs), memory, and/or storage devices, etc. Each IT component may perform data processing tasks, where the IT component may include software installed in a storage device, loaded into the memory, and executed by one or more processors to perform the data processing tasks. In one embodiment, the electronics boards 507 may each be similar (or the same) as electronics board 42 in FIG. 4.

Electronics rack 500 further includes optional RMU 502 configured to provide and manage power supplied to servers 507, fan modules 531, and CDU 523. Optimization module 521 and RMC 505 can communicate with a controller in some of the applications. RMU 502 may be coupled to PSU 550 to manage the power consumption of the PSU. The PSU 550 may include the necessary circuitry (e.g., an alternating current (AC) to direct current (DC) or DC to DC power converter, backup battery, transformer, or regulator, etc.) to provide power to the rest of the components of electronics rack 500.

In one embodiment, the (e.g., PSU 550 of the) electronics rack 500 may draw power from the AC mains to power electronics mounted therein. In another embodiment, the rack may draw power from one or more renewable power sources, such as a photovoltaic (PV) power system. In this case, the electronics rack may draw power from one or more renewable energy sources (e.g., PV systems), and supply the electronics boards 507 and/or other components of the electronics rack cooling capabilities and/or perform leak detection operations, as described herein. In one embodiment, the PSU may be electrically coupled to any type of power source.

In one embodiment, RMU 502 includes optimization module 521 and rack management controller (RMC) 505. RMC 505 may include a monitor to monitor operating status of various components within electronics rack 500, such as, for example, the electronics boards 507, CDU 523, and fan modules 531. Specifically, the monitor receives operating data from various sensors representing the operating environments of electronics rack 500. For example, the monitor may receive operating data representing temperatures of the processors, cooling liquid, and airflows, which may be captured and collected via various temperature sensors. The monitor may also receive data representing the fan power and pump power generated by the fan modules 531 and liquid pump 514, which may be proportional to their respective speeds. These operating data are referred to as real-time operating data. Note that the monitor may be implemented as a separate module within RMU 505.

Based on the operating data, optimization module 521 performs an optimization using a predetermined optimization function or optimization model to derive a set of optimal fan speeds for fan modules 531 and an optimal pump speed for liquid pump 514, such that the total power consumption of liquid pump 514 and fan modules 531 reaches minimum, while the operating data associated with liquid pump 514 and cooling fans of fan modules 531 are within their respective designed specifications. Once the optimal pump speed and optimal fan speeds have been determined, RMC 505 configures liquid pump 514 and cooling fans of fan modules 531 based on the optimal pump speed and fan speeds.

As an example, based on the optimal pump speed, RMC 505 communicates with a pump controller of CDU 523 to control the speed of liquid pump 514, which in turn controls a liquid flow rate of cooling liquid supplied to the supply rack distribution manifold of the rack cooling module to be distributed to at least some of server blades 507. Therefore, the operating condition and the corresponding cooling device performance are adjusted. Similarly, based on the optimal fan speeds, RMC 505 communicates with each of the fan modules 531 to control the speed of each cooling fan of the fan modules 531, which in turn control the airflow rates of the fan modules 531. Note that each of fan modules 531 may be individually controlled with its specific optimal fan speed, and different fan modules and/or different cooling fans within the same fan module may have different optimal fan speeds.

Note that some or all of the IT equipment 507 may utilize different cooling methods. For instance, one server may utilize air cooling while another server may utilize liquid cooling. Alternatively, one IT component of a server may utilize air cooling while another IT component of the same server may utilize liquid cooling.

As previously explained, an embodiment of the disclosure may be (or include) a non-transitory machine-readable medium (such as microelectronic memory) having stored thereon instructions, which program one or more data processing components (generically referred to here as a "processor") to perform liquid segregation and detection operations, as described herein. In other embodiments, some of these operations might be performed by specific hardware components that contain hardwired logic. Those operations might alternatively be performed by any combination of programmed data processing components and fixed hardwired circuit components.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

While certain embodiments have been described and shown in the accompanying drawings, it is to be understood that such embodiments are merely illustrative of and not restrictive on the broad disclosure, and that the disclosure is not limited to the specific constructions and arrangements shown and described, since various other modifications may occur to those of ordinary skill in the art. The description is thus to be regarded as illustrative instead of limiting.

In some embodiments, this disclosure may include the language, for example, "at least one of [element A] and [element B]." This language may refer to one or more of the elements. For example, "at least one of A and B" may refer to "A," "B," or "A and B." Specifically, "at least one of A and B" may refer to "at least one of A and at least one of B," or "at least of either A or B." In some embodiments, this disclosure may include the language, for example, "[element A], [element B], and/or [element C]." This language may refer to either of the elements or any combination thereof. For instance, "A, B, and/or C" may refer to "A," "B," "C," "A and B," "A and C," "B and C," or "A, B, and C."

What is claimed is:

1. A rack cooling module for an electronics rack, comprising:
   a manifold section that includes
      a supply manifold that is coupled to a supply manifold connector, the supply manifold is arranged to supply liquid coolant from a coolant source to the supply manifold connector, and
      a return manifold that is coupled to a return manifold connector, the return manifold is arranged to return liquid coolant from the return manifold connector to the coolant source;
   a detection section that includes
      a channel that extends vertically within the detection section, and
      a leak detection sensor that is disposed within the channel;
   a pump that couples the channel to the return manifold; and
   a valve that couples the channel to the supply manifold.

2. The rack cooling module of claim 1, wherein the valve is a first valve, wherein the rack cooling module further comprises a second valve that is coupled between the pump and the return manifold.

3. The rack cooling module of claim 1, wherein the pump is coupled to a bottom end of the channel.

4. The rack cooling module of claim 3, wherein the valve is coupled to a top end of the channel, wherein the leak detection sensor is disposed between the top end and the bottom end of the channel.

5. The rack cooling module of claim 4, wherein the valve is coupled to the supply manifold above the supply manifold connector.

6. The rack cooling module of claim 1 further comprises a controller that is electrically coupled to the leak detection sensor and the pump, wherein the controller is configured to activate the pump in response to receiving a control signal from the leak detection sensor that indicates a presence of liquid coolant within the channel.

7. The rack cooling module of claim 6, wherein the controller is electrically coupled to the valve, and is configured to open the valve to allow the liquid coolant to flow from the supply manifold into the channel to determine whether the leak detection sensor is functioning based on whether the control signal is received.

8. The rack cooling module of claim 1, wherein the detection section further includes an opening into the channel that is arranged to receive liquid coolant that leaks from an equipment cooling module that is coupled to the rack cooling module, wherein the leak detection sensor is arranged to detect a presence of liquid coolant that flows from either 1) the opening of the detection section or 2) a portion of the channel that is above the opening.

9. A leak segregation and detection system for an electronics rack, the system comprising:
   a rack cooling module that includes:
      a manifold section that has
         a supply manifold that is coupled to a supply manifold connector, the supply manifold is arranged to supply liquid coolant from a coolant source to the supply manifold connector, and a return manifold that is coupled to a return manifold connector, the return manifold is arranged to return liquid coolant from the return manifold connector to the coolant source, a detection section that includes:
a channel that extends vertically within the detection section,
a first opening into the channel, and
a leak detection sensor that is disposed within the channel, a pump that couples the channel to the return manifold, and a valve that couples the channel to the supply manifold; and an equipment cooling module that includes:
a pair of supply and return connectors that are coupled to a cold plate that is arranged to couple with an information technology (IT) component of an electronics board, and
a conducting structure that includes a second opening that opens into an interior of the equipment cooling module in which the cold plate is disposed, wherein the equipment cooling module is arranged to couple to the rack cooling module by the pair of supply and return connectors coupling to the supply and return manifold connectors, respectively, and the conducting structure insertably coupling into the first opening such that the second opening opens into the channel.

10. The system of claim 9, wherein the valve is a first valve, wherein the rack cooling module further comprises a second valve that is coupled between the pump and the return manifold.

11. The system of claim 9, wherein the pump is coupled to a bottom end of the channel.

12. The system of claim 11, wherein the valve is coupled to a top end of the channel, wherein the leak detection sensor is disposed between the top end and the bottom end of the channel.

13. The system of claim 12, wherein the valve is coupled to the supply manifold above the supply manifold connector.

14. The system of claim 9 further comprising a controller that is electrically coupled to the leak detection sensor and the pump, wherein the controller is configured to activate the pump in response to receiving a control signal from the leak detection sensor that indicates a presence of liquid coolant within the channel.

15. The system of claim 14, wherein the controller is electrically coupled to the valve, and is configured to open the valve to allow the liquid coolant to flow from the supply manifold into the channel to determine whether the leak detection sensor is functioning based on whether the control signal is received.

16. The system of claim 9, wherein the leak detection sensor is arranged to detect a presence of liquid coolant that flows from either 1) the first opening of the detection section or 2) a portion of the channel that is above the first opening.

17. A method performed by a rack cooling module for an electronics rack, the method comprising:
while a heat exchanging loop is established between an equipment cooling module and the rack cooling module in which liquid coolant within a supply manifold of the rack cooling module flows through a cold plate of the equipment cooling module and into a return manifold of the rack cooling module, receiving a control signal from a leak detection sensor that is disposed within a channel of a detection section of the rack cooling module that indicates a presence of liquid coolant within the channel; and
in response to receiving the control signal, activating a pump that is coupled between the channel of the return manifold,
wherein the equipment cooling module includes a conducting structure that has a first opening that opens into an interior of the equipment cooling module in which the cold plate is disposed,
wherein the equipment cooling module couples to the rack cooling module by a supply connector and a return connector of the equipment cooling module coupling to a supply manifold connector of the supply manifold and a return manifold connector of the return manifold, respectively, and the conducting structure insertably couples into a second opening such that the first opening opens into the channel.

18. The method of claim 17 further comprising, after a period of time from when the control signal is received, preventing liquid coolant from flowing from the supply manifold into the equipment cooling module.

19. The method of claim 17 further comprising determining whether the leak detection sensor is functioning by opening a valve that is coupled between the supply manifold and the channel such that liquid coolant is allowed to flow from the supply manifold and into the channel.

20. The method of claim 17 further comprising, in response to receiving the control signal, opening a valve that is coupled between the pump and the return manifold before activating the pump.

* * * * *